Figure 1:
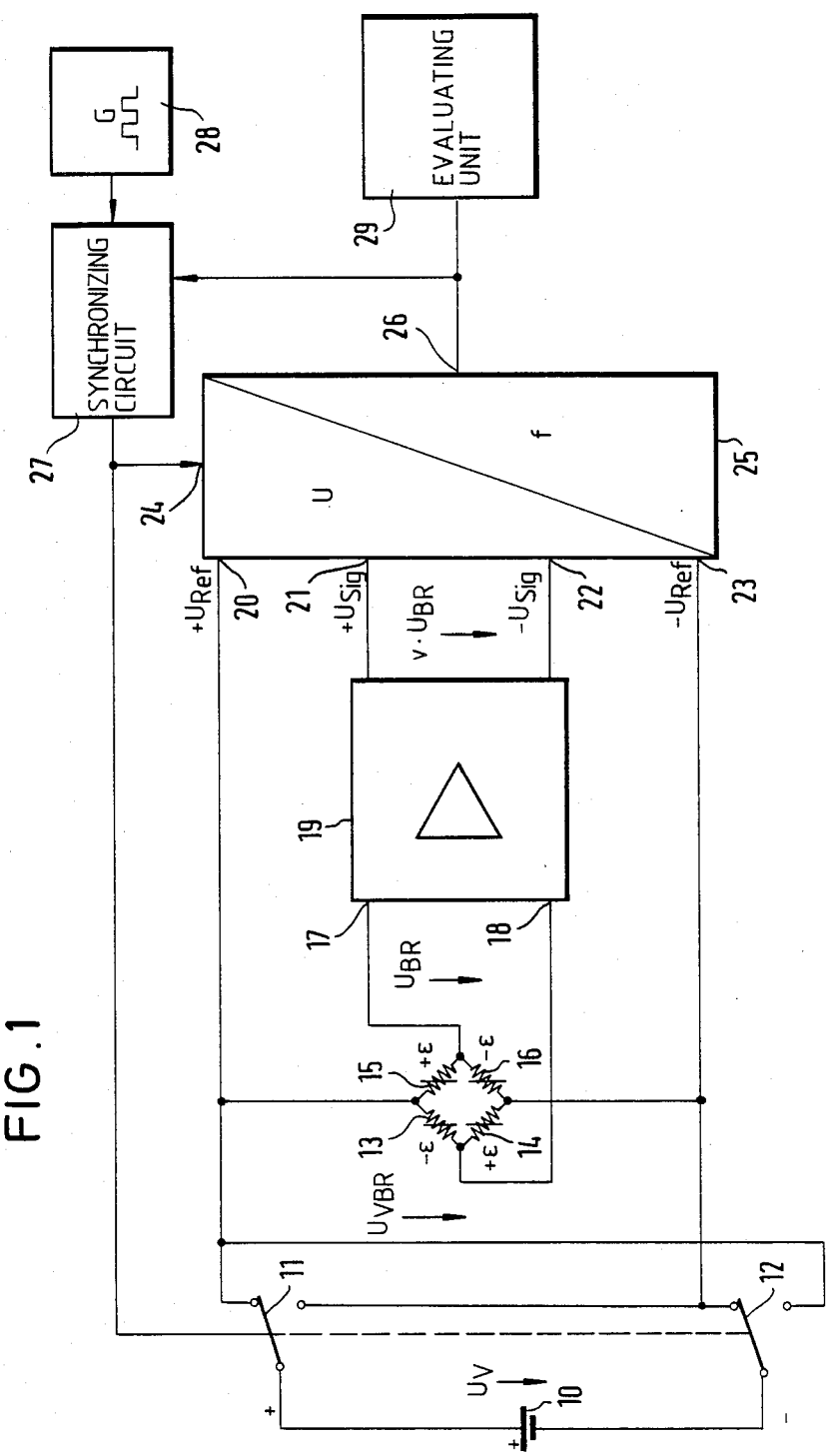

United States Patent [19]

Schneider et al.

[11] Patent Number: 4,862,382
[45] Date of Patent: Aug. 29, 1989

[54] ARRANGEMENT FOR PROCESSING THE OUTPUT SIGNALS OF A RESISTANCE BRIDGE

[75] Inventors: Georg Schneider, Schopfheim-Langenau; Markus Bausch, Lörrach-Brombach, both of Fed. Rep. of Germany

[73] Assignee: Endress u. Hauser GmbH u. Co., Fed. Rep. of Germany

[21] Appl. No.: 100,589

[22] Filed: Sep. 24, 1987

[30] Foreign Application Priority Data

Oct. 3, 1986 [DE] Fed. Rep. of Germany ....... 3633790

[51] Int. Cl.$^4$ ........................ G06F 15/20; H03K 5/00
[52] U.S. Cl. ........................... 364/481; 324/62; 324/DIG. 1; 328/140; 364/571.01
[58] Field of Search ................... 364/481, 571, 571.01; 324/62, 63, DIG. 1, 105, 65 R; 323/244; 328/140

[56] References Cited

U.S. PATENT DOCUMENTS

| | | | |
|---|---|---|---|
| 3,960,010 | 6/1976 | Gustafsson | 324/105 |
| 4,031,532 | 6/1977 | First | 328/140 |
| 4,115,767 | 9/1978 | Brosh et al. | 328/140 |
| 4,204,171 | 5/1980 | Sutphin, Jr. | 328/140 |
| 4,245,192 | 1/1981 | Whiffen | 328/140 |
| 4,296,413 | 10/1981 | Milkovic | 324/62 |
| 4,618,818 | 10/1986 | Horn | 324/62 |

FOREIGN PATENT DOCUMENTS

| | | |
|---|---|---|
| 2319195 | 10/1974 | Fed. Rep. of Germany . |
| 2450111 | 4/1975 | Fed. Rep. of Germany . |
| 2949467 | 10/1980 | Fed. Rep. of Germany . |
| 2855482 | 2/1981 | Fed. Rep. of Germany . |
| 3330841 | 8/1983 | Fed. Rep. of Germany . |
| 2363522 | 3/1985 | Fed. Rep. of Germany . |

OTHER PUBLICATIONS

"Electronic Engineering" Publication, Jan. 1985, p. 62.

Primary Examiner—Parshotam S. Lall
Assistant Examiner—Kevin J. Teska
Attorney, Agent, or Firm—Barnes & Thornburg

[57] ABSTRACT

The invention relates to an arrangement for processing the output signals of a resistance bridge supplied with a DC voltage or a direct current with periodically reversed polarity. The arrangement further comprises a clock generator furnishing a clock signal controlling said reversal. The output signal of the resistance bridge is amplified in a bridge amplifier and supplied to a voltage-frequency converter with signal and reference inputs. The output frequency of said voltage-frequency converter is the output signal of the arrangement. The instantaneous bridge supply is used as reference for the voltage-frequency converter and the reversal of the polarity of the bridge supply is synchronized with the output frequency. The measurement of the output frequency in the following evaluating units takes place in such a manner that the mean value is formed over a whole number of reversal clock periods.

6 Claims, 4 Drawing Sheets

ARRANGEMENT FOR PROCESSING THE OUTPUT SIGNALS OF A RESISTANCE BRIDGE

The invention relates to an arrangement for processing the output signals of a resistance bridge which is supplied with a DC voltage or a direct current with periodically reversed polarity, comprising a clock generator furnishing a clock signal controlling said reversal, a bridge amplifier and a voltage-frequency converter with signal and reference inputs, to the signal inputs of which the amplified bridge output voltage is supplied and the output frequency of which is the output signal of the circuit.

In uses in which high demands are made of the precision of the measurement, for example in the weighing art, in signal processing systems for evaluating resistance bridges AC voltage supply, AC voltage amplification and subsequent phase-selective rectification is employed. This achieves the necessary suppression of the influences of contact voltages and thermovoltages and the zero point drifts of the amplifiers. A disadvantage of such arrangements is the necessary high circuit technological expenditure and the necessary setting and calibration procedures. Furthermore, the supply voltage must be stabilized with respect to outer influences so that the sensitivity of the arrangement is not affected thereby.

With the arrangement according to the invention these disadvantages are avoided in that the instantaneous bridge supply is used as reference voltage of the voltage-frequency converter, that the reversal of the polarity of the bridge supply is synchronized with the output frequency and in that the measurement of the output frequency of the output signal takes place in following evaluating units in such a manner that the mean value is formed over a whole number of reversal clock periods.

The suppression of the influence of contact voltages and thermovoltages is achieved in that the polarity of the bridge supply is reversed, the duration of the positive supply on an average being equal to the duration of the negative supply and for suppressing measurement errors the reversal is synchronized with the output clock cycles of the voltage-frequency converter. The influence of the actual bridge supply on the output frequency is eliminated in that it is used as reference defining the slope of the voltage-frequency characteristic of the converter. If the output frequency is measured over a period of time during which equally long positive and negative bridge supply took place the aforementioned additive error voltages have no influence on the result. In addition, the frequency-analog output provides a signal which because of its digital character can be easily transmitted and converted to a digital numerical value.

Advantageous embodiments of the arrangement and further developments of the arrangement according to the invention are set forth in the subsidiary claims.

Figure 2:
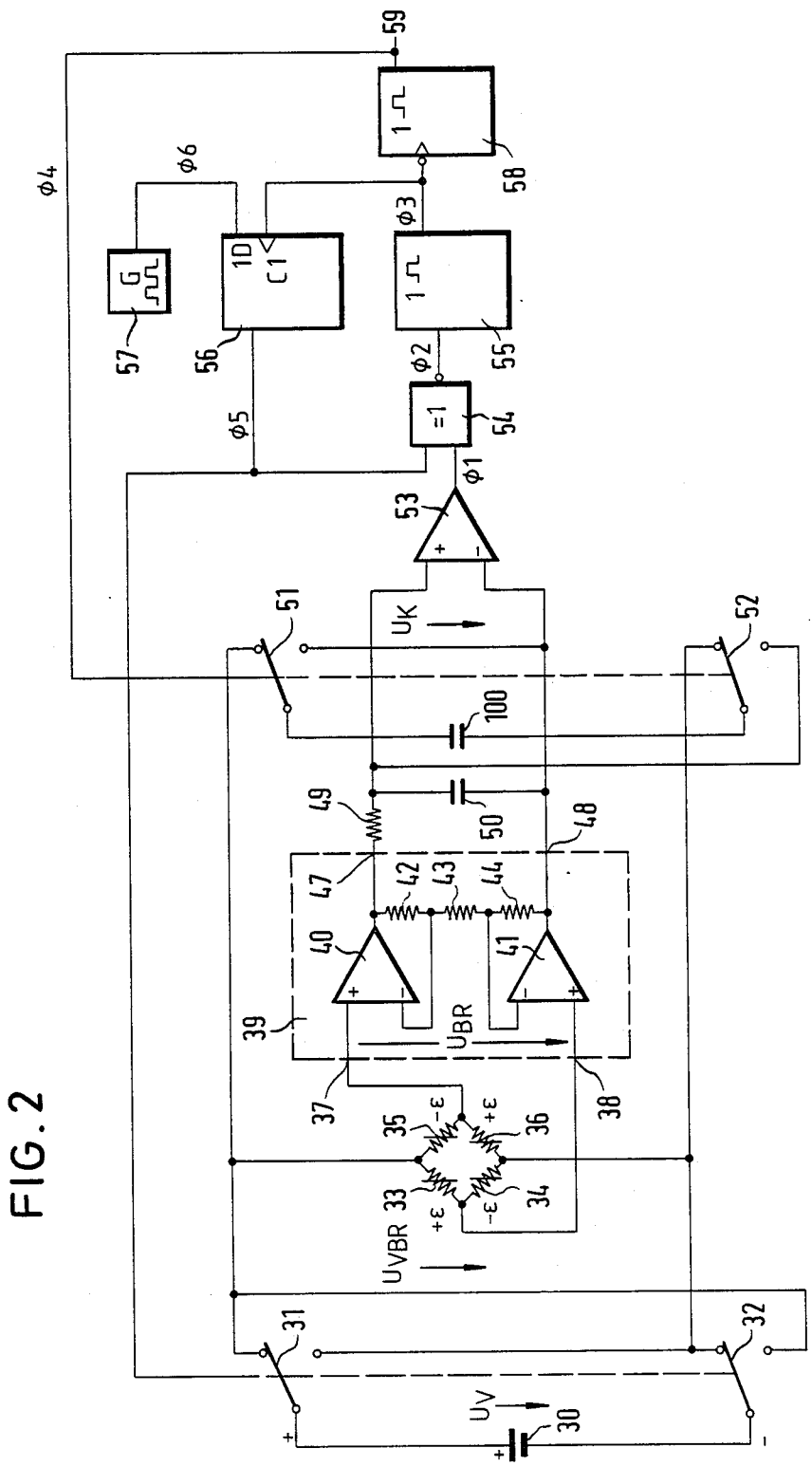
Figure 3:
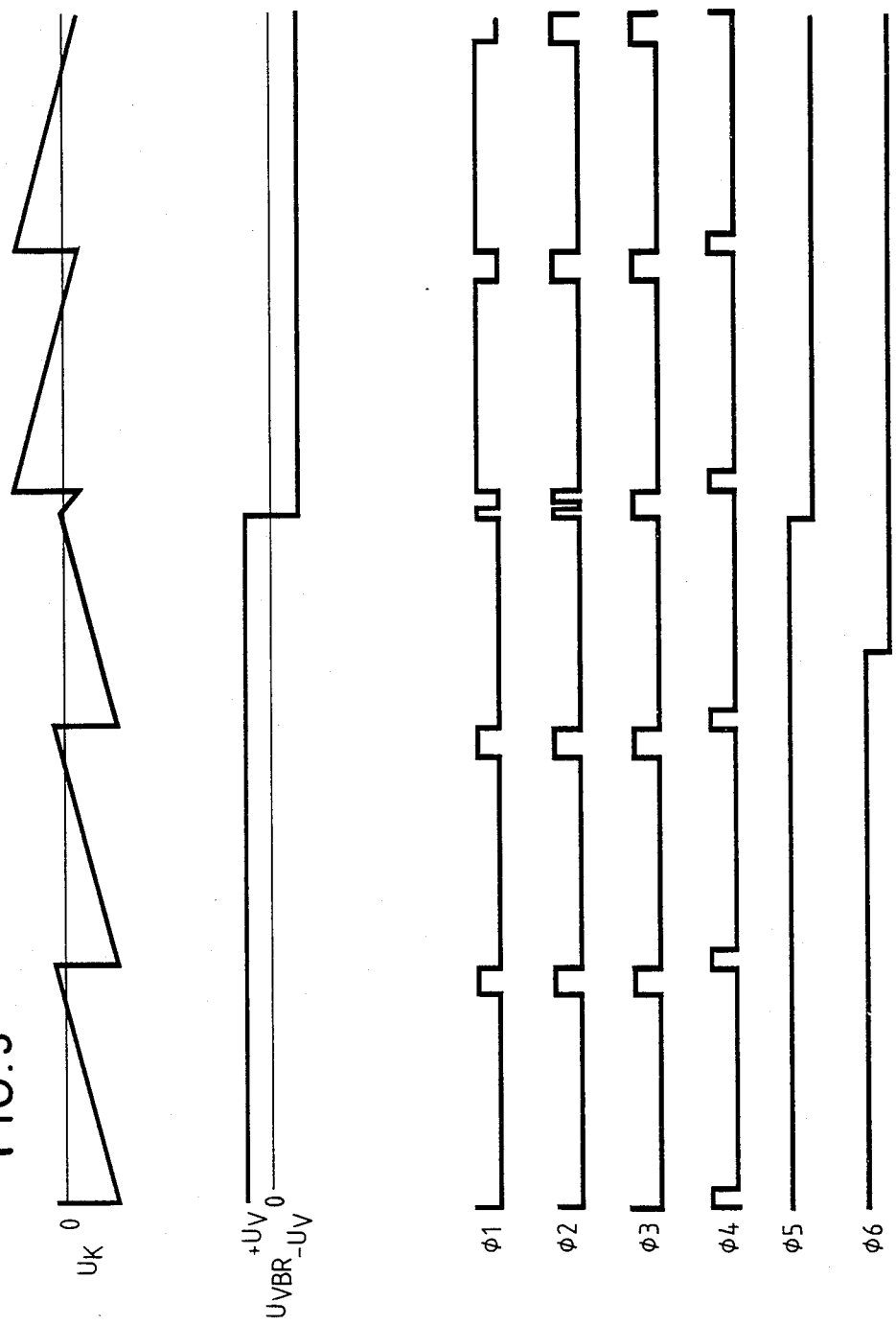
Figure 4:
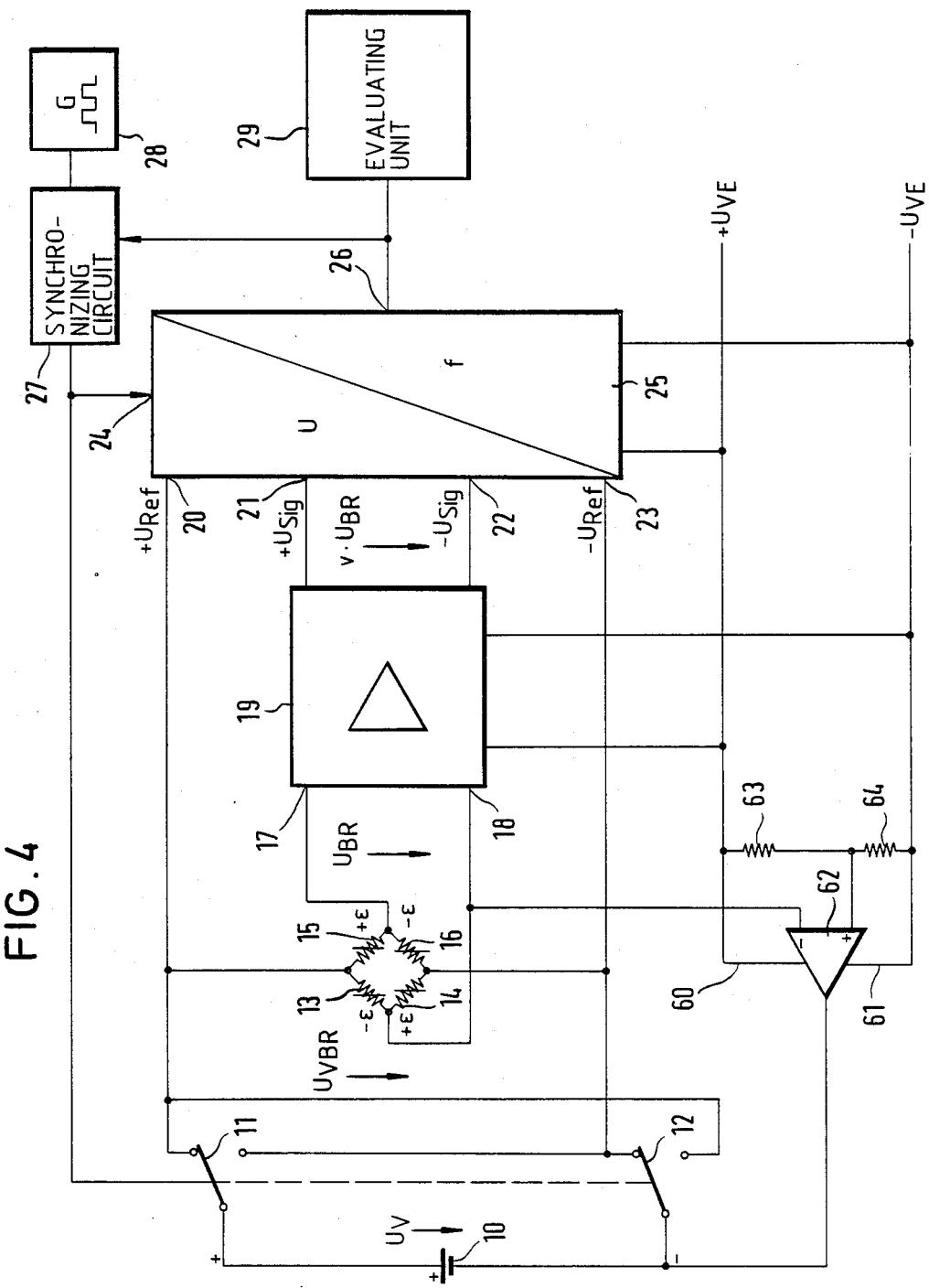

Further features and advantages of the invention will be apparent from the following description of an example of embodiment illustrated in the drawings, wherein:

FIG. 1 is a block circuit diagram of an arrangement according to the invention for processing the output signals of a resistance bridge, FIG. 2 is an embodiment of the arrangement of FIG. 1 based on quantized charge transport with switch-capacitor arrangements, FIG. 3 is a representation of the time profile of important signals in the arrangement of FIG. 2 and FIG. 4 is the block circuit diagram of a modified embodiment in which the reference potential of the bridge supply is set in such a manner that the bridge output signals are kept at approximately constant potential with respect to the supply of the following electronics.

The arrangement illustrated in FIG. 1 includes a resistance bridge which consists of four bridge resistors 13, 14, 15 and 16. The four bridge resistors 13 to 16 in the balanced state have the same resistance R and on unbalance change by the same resistance $\pm \Delta R$ or by the same factor $(1 \pm \epsilon)$ with $\epsilon = \Delta R/R$. In each case two diagonally opposite resistances change in the same sense with respect to each other and in the opposite sense with respect to the other two resistances. The supply of the resistance bridge is from a DC voltage source 10 having a voltage $U_V$ via the changeover switches 11 and 12. The changeover switches 11 and 12 are simultaneously actuated by a control signal so that they reverse the bridge supply voltage $U_{VBR}$ applied to the one bridge diagonal between the voltages $+U_V$ and $-U_V$.

Corresponding to the unbalance of the bridge resistances 13 to 16 at the other bridge diagonal the bridge output voltage $U_{BR}$ results and is applied to the inputs 17 and 18 of a bridge amplifier 19 with gain v.

The amplified output signal $v \cdot U_{BR}$ of the bridge amplifier 19 is supplied to the signal inputs 21 and 22 of a voltage-frequency converter 25 which further has two reference inputs 20, 23 and a control input 24. Applied to the reference inputs 20, 23 is the bridge supply voltage $U_{VBR}$ as reference voltage and the control input 24 receives the control signal which actuates the changeover switches 11 and 12. The voltage-frequency converter 25 converts the voltage $v \cdot U_{BR}$ applied to the signal inputs 21 and 22 to an AC voltage which is furnished at the output 26 and the frequency $f_{aus}$ of which is represented by the following equation:

$$f_{out} = \frac{U_{+Sig} - U_{-Sig}}{U_{+Ref} - U_{-Ref}} \cdot f_0 = \frac{v \cdot U_{BR}}{U_{VBR}} \cdot f_0$$

wherein
$U_{+sig}$: the voltage at the signal input 21
$U_{-sig}$: the voltage at the signal input 22
$U_{+ref}$: the voltage at the reference input 20
$U_{-ref}$: the voltage at the reference input 23
$f_0$: the calibration frequency
of the voltage-frequency converter 25. Since the output voltage of the resistance bridge generally obeys the relationship $$U_{BR} = k \cdot U_{VBR}$$

this gives finally $$f_{out} = v \cdot k \cdot f_0$$
$$= v \cdot \frac{\Delta R}{R} \cdot f_0$$

By using the actual bridge supply voltage as reference voltage the influence of the absolute value thereof is thus eliminated; the result is independent of the value of the bridge supply voltage $U_{VBR}$. This is known to the expert.

The control signal which reverses the polarity of the bridge supply voltage $U_{VBR}$ by means of the switches 11, 12 and the function of the voltage-frequency converter 25 for negative signal voltages via the input 24 is supplied by a synchronizing circuit 27 which receives a clock signal furnished by a clock generator 28.

If all the error voltages such as thermovoltages, contact voltages and offset voltages of the bridge amplifier 19 and of the voltage-frequency converter 25 are combined into one offset voltage $U_{offs}$, for the two polarities of the bridge supply voltage $U_{VBR}$ the following output frequencies are obtained at the output 26 of the voltage-frequency converter 25:

$$f_{out+} = v \cdot \frac{+U_{BR} + U_{offs}}{+U_{VBR}} \cdot f_0$$

$$f_{out-} = v \cdot \frac{-U_{BR} + U_{offs}}{-U_{VBR}} \cdot f_0$$

Now, if in an evaluating unit 29 connected to the output 26 of the voltage-frequency converter 25 the output frequency $f_{aus}$ is measured in such a manner that the two polarities of the bridge supply voltage $U_{VBR}$ are incorporated via the same time duration into the result and the mean value of the two measured frequencies $f_{out+}$ and $f_{out-}$ is formed, the influence of $U_{offs}$ is eliminated.

The reversal of the voltage-frequency converter 25 for negative input voltages by the control signal applied to the control input 24 is necessary in cases in which as in the example of FIG. 2 a symmetrical function of the voltage-frequency converter with regard to the input voltages is not present.

FIG. 2 shows in more detail an example of embodiment of the arrangement of FIG. 1 and FIG. 3 shows the time profiles of important signals which occur in the circuit of FIG. 2. The resistance bridge illustrated in FIG. 2 and consisting of the resistors 33, 34, 35, 36 receives the bridge supply voltage $U_{VBR}$ from the DC voltage source 30 with the voltage $U_V$ via the changeover switches 31 and 32. The function of these elements corresponds to that of the corresponding elements of FIG. 1 and will not be explained again.

The bridge amplifier 39 consists of two operational amplifiers 40, 41 and three resistors 42, 43, 44. This is a circuit known to the expert, the resistors 42 and 44 generally having the same resistance. If this resistance is denoted by $R_{44}$ and that of the resistor 43 by $R_{43}$ the bridge amplifier 39 amplifies the bridge output voltage $U_{BR} = U_{37} - U_{38}$ applied to its inputs 37 and 38 in accordance with the equation:

$$U_{47} - U_{48} = (U_{37} - U_{38}) \cdot \left(1 + 2 \cdot \frac{R_{44}}{R_{43}}\right)$$

To the two outputs 47, 48 of the bridge amplifier 39 an RC member comprising a resistor 49 and a capacitor 50 is connected. Two changeover switches 51 and 52 actuated by a control signal apply in the one position, which is illustrated in FIG. 2, the bridge supply voltage $U_{VBR}$ to a second capacitor 100 whilst in their other position they connect the capacitor 100 in parallel with the capacitor 50. The two terminals of the capacitor 50 are connected to the two inputs of a comparator 53 so that the voltage $U_K$ at the capacitor 50 forms the input voltage of the comparator. The output of the comparator 53 is connected to the one input of an exclusive NOR stage 54 which at its other input receives the control signal actuating the changeover switches 31 and 32. This other input of the exclusive NOR stage 54 thus corresponds to the control input 24 of FIG. 1.

Connected to the output of the exclusive NOR stage 54 is the trigger input of a monostable flip-flop 55 whose output is connected to the trigger input of a second monostable flip-flop 58 which at its output 59 furnishes the control signal for the changeover switches 51 and 52. The circuit components hitherto described are connected to the outputs 47, 48 of the bridge amplifier 39 and form the voltage-frequency converter whose mode of operation is based on the principle of quantized charge transport. The output 59 of the monostable flip-flop 58 forms the output of the voltage-frequency converter to which the evaluating unit not illustrated in FIG. 2 is connected.

The synchronizing circuit 27 of FIG. 1 is formed in FIG. 2 by a D-flip-flop 56 whose D-input receives the clock signal furnished by the clock generator 57. The clock input of the D-flip-flop 56 is connected to the output of the monostable flip-flop 55. The output signal of the D-flip-flop 56 forms the control signal which on the one hand actuates the changeover switches 31, 32 and on the other hand is supplied to the exclusive NOR stage 54.

The mode of operation of the circuit of FIG. 2 will now be explained with the aid of the diagrams of FIG. 3. These diagrams show the time profile of the voltage $U_K$ at the capacitor 50 which is applied to the inputs of the comparator 53, the bridge supply voltage $U_{VBR}$ and the signals $\Phi_1$ to $\Phi_6$ which occur at the circuit points designated correspondingly in FIG. 2.

It will first be assumed that the bridge supply voltage $U_{VBR}$ has the positive value $+U_V$. Thus, from the outputs 47, 48 of the bridge amplifier 39 via the resistor 49 a current flows to the capacitor 50 and causes the capacitor voltage $U_K$ to rise. As soon as the voltage $U_K$ exceeds the threshold value of the comparator 53 the output signal $\Phi_1$ of the comparator 53 goes from the logical L level to the logical H level. Depending on the signal state of the control signal $\Phi_5$ at its other input the exclusive NOR stage 56 either switches the signal $\Phi_1$ through unchanged or inverts said signal, thereby giving the signal $\Phi_2$. In the diagrams of FIG. 3 it is assumed that the changeover switches 31 and 32 assume the position corresponding to the positive bridge supply voltage $U_{VBR}$ at the H level of the signal $\Phi_5$ so that the signal $\Phi_1$ with this polarity of the bridge supply voltage is switched through unchanged.

With the rising edge of the signal $\Phi_2$ the monostable flip-flop 55 is triggered so that the output signal $\Phi_3$ thereof for a predetermined period of time changes to the H level. With the dropping edge of the signal $\Phi_3$ the second monostable flip-flop 58 is triggered and the output signal $\Phi_4$ thereof thereby also goes to the H level for a predetermined period of time. The signal $\Phi_4$ brings the changeover switches 51 and 52 for the duration of its H level to the other position, the capacitor 100, which up to this instant was charged to the instantaneous bridge supply voltage, is thereby connected parallel to the capacitor 50 and discharges to said capacitor. In doing so, it gives up the charge:

$$\Delta Q = (-U_{VBR} - U_{rest}) \cdot C_{100}$$

where $C_{100}$ is the capacitance of the capacitor 100. The voltage $U_{rest}$ is equal to the voltage across the capacitors at the instant of disconnection of the capacitor 100 from the capacitor 50. The reversal of the sign is achieved by the connection shown in FIG. 2 of the changeover switches 51 and 52 to the terminals of the capacitor 50. On the charge transport the voltage $U_K$ of the capacitor 50 changes by the amount:

$$\Delta U_K = \frac{\Delta Q}{C_{50} + C_{100}} = \frac{(-U_{VBR} - U_{rest}) \cdot C_{100}}{C_{50} + C_{100}}$$

After expiry of the time determined by the monostable flip-flop 58 the capacitor 100 is again separated from the capacitor 50 and connected to the bridge supply voltage $U_{VBR}$. The offset voltage of the comparator 53 can be kept negligibly small with respect to the value of the bridge supply voltage $U_{VBR}$ so that the residual voltage $U_{rest}$ which the capacitor 100 has on disconnection of the capacitor 50 depends solely on the values of the capacitors 50 and 100 and the instantaneous value of the bridge supply voltage $U_{VBR}$ and thus does not incorporate any systematic error. A requirement for this is that the connection of the capacitor 100 to the capacitor 50 takes place for such a short time that the charging of the capacitors dependent on the bridge output voltage $U_{BR}$ remains negligible.

Due to the continuous charging and the compensating charge balance cycles the voltage $U_K$ assumes a fixed mean value. To avoid continuously shifting this mean value of the voltage $U_k$ by the charges constantly supplied with the current via the resistor 49 the charge supplied via the charge balance cycles must compensate this value on an average. The necessary number of the cycles per unit of time is obtained through the charge balance equation:

$$i_{R49} \cdot T_{out} = U_{VBR} \cdot C_{100}$$

with $T_{out}$ as the period duration of the output signal frequency $f_{out}$. If the relationship for the current flowing through the resistor 49 is inserted into this equation the result is:

$$U_{VBR} \cdot C_{100} \cdot f_{out} = \left( v \cdot U_{BR} - U_{VBR} \cdot \frac{C_{100}}{2 \cdot (C_{50} + C_{100})} \right) \cdot \frac{1}{R_{49}}$$

The second term in brackets on the right side is the mean value of the voltage $U_k$ at the capacitor 50. If the above relationship for the bridge output voltage $U_{BR}$ is inserted, we have:

$$f_{out} = \left( v \cdot \frac{\Delta R}{R} - \frac{C_{100}}{2 \cdot (C_{50} + C_{100})} \right) \cdot \frac{1}{R_{49} \cdot C_{100}}$$

The actual bridge supply voltage $U_{VBR}$ has no influence.

The equation disregards that between the exceeding of the threshold value of the comparator 53 and the initiation of the compensation there is a period of time governed by the monostable flip-flop 55. This causes a shift of the mean value of the voltage $U_K$ dependent on the actual bridge output voltage $U_{BR}$ because during this time the voltage $U_K$ further changes with the slope defined by the bridge output voltage $U_{BR}$. The synchronizing circuit formed by the D-flip-flop 56 effects that the polarity reversal of the bridge supply voltage $U_{VBR}$ is synchronized with the instant of the threshold exceeding and thus takes place before the instant of the charge compensation as illustrated in FIG. 3. As a result the threshold exceeding for both operating directions has the same value and thus acts like a constant factor which changes the gain of the system and is incorporated into the calibration of the slope of the voltage-frequency characteristic and does not influence the result of the measurement.

If the clock signal $\Phi_6$ influencing the bridge supply voltage changes its level the D-flip-flop 56 does not change its state until the next rising edge of the output signal $\Phi_3$ of the monostable flip-flop 55. Not until this instant does the level of the signal $\Phi_5$ change, thereby reversing the polarity of the bridge supply voltage $U_{VBR}$. The bridge output voltage $U_{BR}$ and thus the output voltage $v \cdot U_{BR}$ of the bridge amplifier 39 reverse their signs and the voltage $U_K$ again decreases. When the value drops below the threshold value the output signal $\Phi_1$ of the comparator 53 again changes to the L level. Simultaneously with the polarity reversal of the bridge supply voltage $U_{VBR}$ the level change of the signal $\Phi_5$ at the second input of the exclusive NOR stage 54 causes the signal $\Phi_2$ to correspond to the negated output signal $\Phi_1$ of the comparator 53 for the remaining duration of said bridge supply polarity. After expiry of the period of time governed by the monostable flip-flop 55, with the declining edge of the signal $\Phi_3$ the monostable flip-flop 58 is triggered and a charge balance cycle initiated. During the period of time in which the signal $\Phi_3$ has the H level and the bridge supply voltage $U_{VBR}$ has already assumed the changed polarity the capacitor 100 is charged to said new voltage. The subsequently initiated compensation cycle thus already takes place with the correct polarity. This is the reason for the introduction of the delay by means of the monostable flip-flop 55. Since the voltage $U_K$ at the instant of the compensation is already at the same value for all subsequent charge balance cycles the time elapsing until initiation of the following compensation corresponds exactly to the duration of the following cycles.

The nature of the synchronization chosen thus eliminates errors in the reversal of the polarity.

A point is still to be explained with regard to the inexactly defined state of the output signal $\Phi_1$ of the comparator 53 and of the signal $\Phi_2$ of the exclusive NOR stage 54 in the region of the reversal operation. The possible level changes do not have any influence on the cycle if the monostable flip-flop 55 cannot be subsequently triggered during the period in which its output signal $\Phi_3$ has the H level.

A fundamental requirement for the function of the circuit is that the output frequency $f_{out}$ generated is not lower than the clock frequency of the clock signal $\Phi_6$ controlling the polarity reversal of the bridge supply voltage $U_{VBR}$ since otherwise it may happen that the comparator threshold is not exceeded. Due to the symmetrical supply with positive and negative voltage the voltage $U_K$ would then vary about an undefined mean value.

FIG. 4 shows a simple example of embodiment of an arrangement in which the reference potential of the bridge supply is predefined in such a manner that the bridge output voltage is held at approximately constant potential with respect to the supply of the following electronics. The basic arrangement corresponds to that of FIG. 1 and all elements corresponding to elements in FIG. 1 are provided with the same reference numerals and have the same function and will therefore not be described again. In addition two lines 60 and 61 are shown on which the positive supply voltage $+U_{VE}$ and the negative supply voltage $-U_{VE}$ respectively are available for the various circuit components of the electronics. Added is a control circuit consisting of an amplifier 62 and two resistors 63 and 64. The resistors 63 and 64 form a voltage divider which sets the non-inverting input of the amplifier 62 at a potential fixed with respect to the supply voltages $+U_{VE}$ and $-U_{VE}$. The inverting input of the amplifier is connected to the bridge output connected to the input 18 of the bridge amplifier 19. The output of the amplifier 62 is connected to the negative voltage terminal of the bridge supply. A closed-loop control circuit is thus obtained which regulates the negative supply voltage terminal to a potential such that the input of the bridge amplifier 19 is kept at constant potential with respect to the supply voltage of the electronics following the bridge.

The result of this is that shifts of the common-mode input voltages of the bridge amplifier 19 and the following electronics are minimized. This minimizes errors due to lack of common-mode signal suppression of stages occurring on a change in the common-mode voltage in the bridge output signals on reversal of the polarity of the bridge supply voltage.

An improved suppression is achieved if the control is such that it keeps the common-mode voltage constant directly. For this purpose the inverting input of the amplifier is not to be related to a bridge output but to the common-mode voltage $(U_{17}+U_{18})/2$ at the input of the amplifier 19. If required the amplifier 62 is to be connected as integrator. The expert is familiar with this procedure.

We claim:

1. Arrangement for processing output signals of a resistance bridge comprising, a DC voltage source, periodically actuated changeover switching means connecting the terminals of a first bridge diagonal to said DC voltage source so that a bridge supply voltage supplied to said first bridge diagonal is periodically reversed in polarity, a clock generator furnishing a clock signal for controlling the periodic actuation of said changeover switching means, a bridge amplifier having input terminals connected to the terminals of a second diagonal of said resistance bridge and output terminals for furnishing an amplified bridge output voltage, and a voltage to frequency converter having signal input terminals connected to said output terminals of said bridge amplifier and reference input terminals connected to said terminals of said first bridge diagonal so that a reference voltage supplied to said reference inputs is always equal to said bridge supply voltage, said voltage to frequency converter comprising means for integrating said amplified bridge output voltage, means for comparing said integrated amplified bridge output voltage with said reference voltage, and means for generating an output pulse train having a recurrence frequency which is proportional to said bridge output voltage and always higher than the frequency of said clock signal controlling the actuation of said changeover switching means, said clock signal being synchronized with said output pulse train so that the instants of actuation of said changeover switching means have a predetermined time relationship with pulses of said output pulse train.

2. Arrangement according to claim 1, further comprising a control circuit for regulating a reference potential of said bridge supply voltage so that said bridge supply voltage is kept at an approximately constant potential with respect to the supply voltage of electronic circuits connected to the output of said voltage to frequency converter.

3. Arrangement according to claim 1, wherein said voltage to frequency converter comprises an integration capacitor for integrating said amplified bridge output voltage, a threshold comparator for comparing the voltage across said integration capacitor with a predetermined threshold value, a charge balancing capacitor normally connected to said reference voltage, and means which temporarily disconnect said charge balancing capacitor from said reference voltage and connect it in parallel to said integration capacitor for a quantized charge transport every time when said threshold comparator detects that said integration capacitor terminal voltage crosses said threshold value.

4. Arrangement according to claim 3, wherein said voltage to frequency converter comprises a controllable inverter circuit having a signal input coupled to the output of said threshold comparator and a control input receiving said clock signal which controls the actuation of said changeover switching means so that said controllable inverter circuit transmits the output signal of said threshold comparator unchanged when said bridge supply voltage has a first polarity and inverts the output signal of said threshold comparator when said bridge supply voltage has an opposite second polarity.

5. Arrangement according to claim 3, wherein said clock signal controlling the actuation of said changeover switching means is synchronized with said output pulse train in such a manner that each instant of changeover coincides with an instant at which said threshold comparator detects a crossing of said threshold value by said integration capacitor terminal voltage.

6. Arrangement according to claim 5, wherein said voltage to frequency converter comprises a delay device which delays the triggering of the quantized charge transport by parallel connection of said charge balancing capacitor with respect to the instants of crossing of said threshold value.

* * * * *